US010115461B1

(12) United States Patent
Lee et al.

(10) Patent No.: US 10,115,461 B1
(45) Date of Patent: Oct. 30, 2018

(54) ELECTRONIC DEVICE USING RESISTIVE MEMORY ELEMENT AND A RECOVERY OPERATION TO COMPENSATE FOR THRESHOLD DRIFT (71) Applicant: SK hynix Inc., Icheon (KR)

(72) Inventors: Woo-Tae Lee, Seoul (KR); Seok-Man Hong, Seoul (KR); Tae-Hoon Kim, Seongnam (KR); Sang-Hyun Ban, Icheon (KR); Hye-Jung Choi, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/605,603

(22) Filed: May 25, 2017

Related U.S. Application Data (60) Provisional application No. 62/341,383, filed on May 25, 2016.

(51) Int. Cl.
G11C 13/00 (2006.01)
G06F 3/06 (2006.01)
G11C 13/04 (2006.01)

(52) U.S. Cl.
CPC .......... *G11C 13/004* (2013.01); *G06F 3/0604* (2013.01); *G06F 3/0659* (2013.01); *G06F 3/0679* (2013.01); *G11C 13/047* (2013.01); G11C 2013/0042 (2013.01)

(58) Field of Classification Search
CPC ................ G11C 13/004; G11C 13/047; G11C 2013/0042; G06F 3/0659; G06F 3/0604; G06F 3/0679
See application file for complete search history.

(56) References Cited

U.S. PATENT DOCUMENTS

| 6,914,801 | B2 | 7/2005 | Kostylev et al. | |
|---|---|---|---|---|
| 2006/0221678 | A1* | 10/2006 | Bedeschi | G11C 11/5678 365/163 |
| 2006/0233019 | A1* | 10/2006 | Kostylev | G11C 11/5678 365/163 |
| 2009/0244962 | A1* | 10/2009 | Gordon | G11C 8/10 365/163 |
| 2015/0213888 | A1* | 7/2015 | Bolandrina | G11C 13/0033 365/163 |

* cited by examiner

Primary Examiner — Son Dinh
Assistant Examiner — Jerome Leboeuf (57) ABSTRACT

An electronic device includes a semiconductor memory, and the semiconductor memory includes a memory cell including a resistive memory element having a high resistance state and a low resistance state according to stored data, a selection element coupled serially to the resistive memory element, and a current clamping transistor electrically connected to a first end of the memory cell to limit an amount of a current flowing through the memory cell. In a drift recovery operation of the memory cell, a rising pulse voltage may be applied to a second end of the memory cell in a state in which the current clamping transistor has been turned off, the first end facing the second end.

12 Claims, 7 Drawing Sheets

ELECTRONIC DEVICE USING RESISTIVE MEMORY ELEMENT AND A RECOVERY OPERATION TO COMPENSATE FOR THRESHOLD DRIFT

CROSS-REFERENCE TO RELATED APPLICATIONS

This application claims the benefit of U.S. Provisional Application No. 62/341,383 filed May 25, 2016, the entire contents of which are incorporated herein by reference.

BACKGROUND

1. Field

Exemplary embodiments of the present invention relate to a memory circuit or device, and an application thereof in an electronic device.

2. Description of the Related Art

Recently, research into next generation memory devices for substituting for a DRAM and a flash memory has been actively conducted. One of such next generation memories is a resistive memory device using a material capable of switching at least two resistive states different from each other by a rapid change in its resistance according to applied bias, that is, a variable resistive material, and its representative example may include a RRAM (Resistive Random Access Memory), a PCRAM (Phase-Change Random Access Memory), a MRAM (Magnetic Random Access Memory), a FRAM (Ferroelectric Random Access Memory), and the like.

Particularly, the resistive memory device constitutes a memory cell array with a cross point array structure. In the cross point array structure, a plurality of lower electrodes (for example, a plurality of row lines (word lines)) and a plurality of upper electrodes (for example, a plurality of column lines (bit lines)) are formed to cross each other and a memory cell, in which a variable resistance element and a selection element have been serially coupled to each other, is arranged at each crossing point thereof.

SUMMARY

Various embodiments are directed to an electronic device that stably reads data of a resistive memory.

In an embodiment, an electronic device includes a semiconductor memory, and the semiconductor memory may include: a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage may be applied to a second end of the memory cell in a state in which the current clamping transistor has been turned off, the first end facing the second end.

Implementations of the above electronic device may include one or more the following.

The selection element may have a snapback characteristic. The selection element may include an OTS (Ovonic Threshold Switch) element.

A voltage change amount/a current change amount of the rising pulse voltage may be adjusted such that a current of the selection element, which is equal to or more than a threshold current amount, instantaneously flows through the memory cell.

The current clamping transistor may include a NMOS transistor, and in the drift recovery operation of the memory cell, a ground voltage is applied to a gate of the current clamping transistor.

In a read operation of the memory cell, a voltage level of the gate of the current clamping transistor may be controlled such that a current, which is larger than the current flowing through the memory cell when the resistive memory element of the memory cell is in the high resistance state and is smaller than the current flowing through the memory cell when the resistive memory element of the memory cell is in the low resistance state, flows through the current clamping transistor.

The semiconductor memory may further include, a sense amplifier that senses a voltage level of the first end of the memory cell in the read operation.

The semiconductor memory may further include, a voltage pulse generator that applies the rising pulse voltage to the second end of the memory cell in the drift recovery operation.

The electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
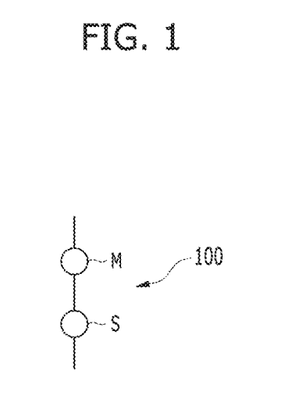
FIG. 1 is a diagram illustrating a memory cell of a semiconductor memory device.
Figure 2:
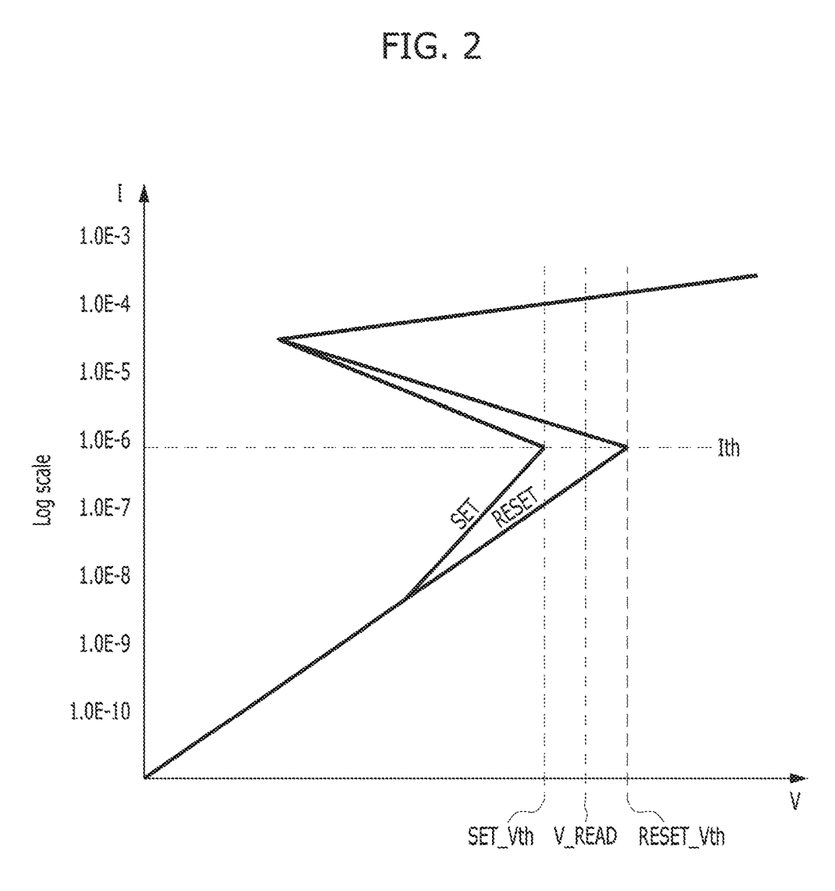
FIG. 2 is a diagram illustrating an I-V curve of the memory cell of FIG. 1.

FIG. 1 is a diagram illustrating a memory cell 100 of a semiconductor memory device, and FIG. 2 is a diagram illustrating an I-V curve of the memory cell 100.

Referring to FIG. 1, the memory cell 100 may include a resistive memory element M and a selection element S.

The resistive memory element M may be in a low resistance state (also called a 'SET' state) or a high resistance state (also called a 'RESET' state) according to data stored therein. The resistive memory element M may include a phase change memory element, and may have a low resistance value in a crystalline state and a high resistance value in an amorphous state.

The selection element S allows a very small current to flow therethrough in a turn-off state, and is turned on when an amount of current flowing through the memory cell 100 exceeds a threshold current value Ith. When the selection element S is turned on, it may allow a larger amount of current to flow therethrough than before. After the selection element S is turned on, a snapback phenomenon may occur such that a voltage level at both ends of the memory cell 100 is significantly reduced in a short time. In an embodiment, the selection element S may include an OTS (Ovonic Threshold Switch) element.

FIG. 2 is a diagram illustrating a current flowing through the memory cell 100 according to a voltage applied to first and second nodes (e.g., both ends) of the memory cell 100. Regardless of whether the memory cell 100 is in a high resistance state (RESET) or in a low resistance state (SET), if a level of the voltage applied to both ends of the memory cell 100 becomes high, an amount of current flowing through the memory cell 100 increases. At substantially the same voltage level, a larger amount of current may flow through the memory cell 100 in the low resistance state (SET) as compared with an amount of current flowing through the memory cell 100 in the high resistance state (RESET).

When a voltage applied to both ends of the memory cell 100 in the low resistance state (SET) reaches a first threshold value SET_Vth, that is, when an amount of current flowing through the memory cell 100 in the low resistance state (SET) reaches the threshold current value Ith, the selection element S of the memory cell 100 in the low resistance state (SET) is turned on, and thus a snapback phenomenon occurs. As a result, a voltage level at both ends of the memory cell 100 is significantly reduced in a short time, and the amount of current flowing through the memory cell 100 significantly increases in a short time.

When a voltage applied to both ends of the memory cell 100 in the high resistance state (RESET) reaches a second threshold value RESET_Vth, that is, when an amount of current flowing through the memory cell 100 in the high resistance state (RESET) reaches the threshold current value Ith, the selection element S of the memory cell 100 in the high resistance state (RESET) is turned on, and thus the snapback phenomenon occurs. As a result, a voltage level at both ends of the memory cell 100 is significantly reduced in a short time, and the amount of current flowing through the memory cell 100 significantly increases in a short time.

A read operation for data stored in the memory cell 100 may be performed using the snapback phenomenon. When a read voltage V_READ, which is larger than the first threshold voltage value SET_Vth in the low resistance state (SET) and smaller than the second threshold voltage value RESET_Vth in the high resistance state (RESET), is applied to both ends of the memory cell 100, the snapback phenomenon occurs in the memory cell 100 in the low resistance state (SET), and thus a large amount of current may flow through the memory cell 100. On the other hand, when the read voltage V_READ is applied to both ends of the memory cell 100, the snapback phenomenon does not occur in the memory cell 100 in the high resistance state (RESET), and thus a small amount of current may flow through the memory cell 100. Accordingly, when the read voltage V_READ is applied to both ends of the memory cell 100 and the amount of current flowing through the memory cell 100 is sensed, it is possible to determine whether the memory cell 100 is in the low resistance state (SET) or the high resistance state (RESET).

Figure 3:
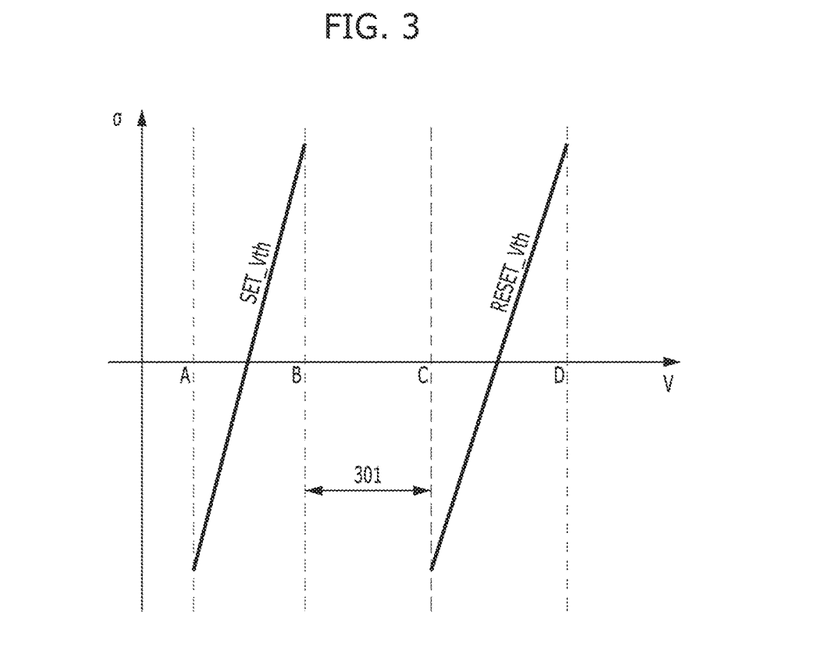
FIG. 3 is a diagram illustrating distributions of threshold voltage values when memory cells in a cell array are in a low resistance state and in a high resistance state.

FIG. 3 is a diagram illustrating distributions of threshold voltage values SET_Vth and threshold voltage values RESET_Vth when memory cells in a cell array are in the low resistance stat (SET) and the high resistance state (RESET), respectively.

The memory cell 100 may be included in a cell array having a plurality of rows and a plurality of columns. The cell array may include is memory cells corresponding to the number of rows×the number of columns. The memory cells in the cell array may not have substantially the same first threshold voltage value SET_Vth or substantially the same second threshold voltage value RESET_Vth. Rather, the memory cells may have different first threshold voltage values SET_Vth and different second threshold voltage values RESET_Vth according to various factors such as process variations and noise. In FIG. 3, a horizontal axis denotes a voltage V, and a vertical axis denotes factors 6 having an influence on the threshold voltage values SET_Vth and RESET_Vth.

Referring to FIG. 3, the first threshold voltage values SET_Vth in the low resistance state (SET) of the memory cells included in the cell array show a distribution of A to B, and the second threshold voltage values RESET_Vth in the high resistance state (RESET) of the memory cells show a distribution of C to D. As the size of the cell array becomes larger, since the number of memory cells included in the cell array increases, distributions of threshold voltage values may also be widened.

Due to the distributions of the threshold voltage values SET_Vth and RESET_Vth as illustrated in FIG. 3, an available range of a read voltage V_READ is reduced. The read voltage V_READ should be larger than the highest value B of the first threshold voltage values SET_Vth in the low resistance state (SET) and should be smaller than the lowest value C of the second threshold voltage values RESET_Vth in the high resistance state (RESET). That is, the available range of the read voltage V_READ may be reduced to a range 301 of FIG. 3 in consideration of the distribution of the threshold voltage values SET_Vth and RESET_Vth.

In a memory cell including a resistive memory element and a selection element, a drift phenomenon may occur such that threshold voltage values change. It has been known that the drift phenomenon mainly occurs because of a trap of charges in a thin film of the selection element.

Figure 4:
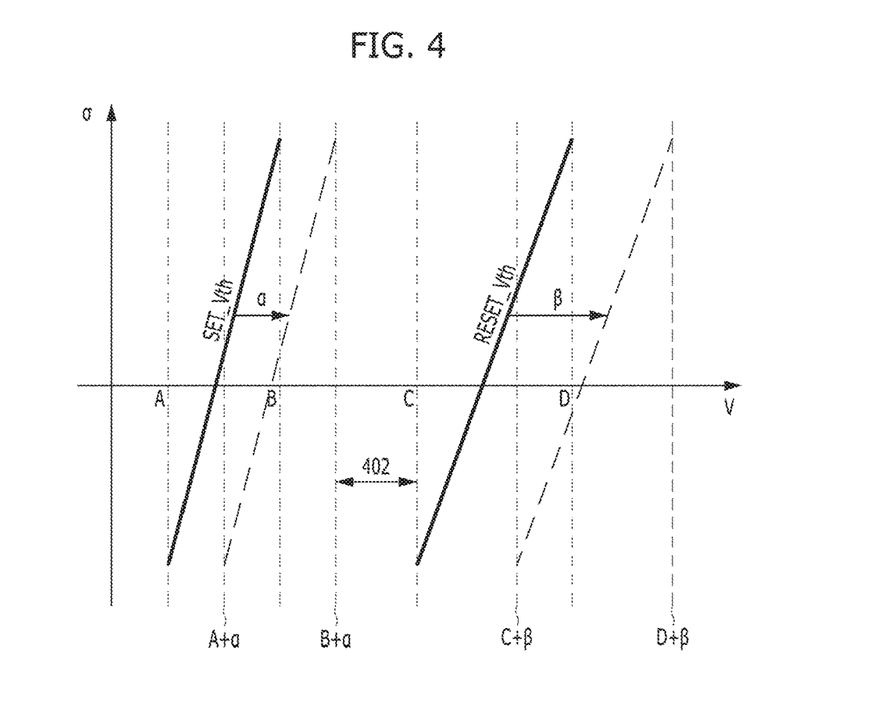
FIG. 4 is a diagram illustrating distributions of threshold voltage values after a drift phenomenon occurred in the memory cells in the cell array.

FIG. 4 illustrates distributions of threshold voltage values SET_Vth and RESET_Vth of the memory cells in the cell array after the drift phenomenon occurred. Referring to FIG. 4, as compared with FIG. 3, the first threshold voltage value SET_Vth in the low resistance state (SET) may increase by $\alpha$ to show a distribution of A+$\alpha$ to B+$\alpha$, and the second threshold voltage value RESET_Vth in the high resistance state (RESET) may increase by $\beta$ to show a distribution of C+$\rho$ to D+$\beta$.

When considering the drift phenomenon as illustrated in FIG. 4, the available range of the read voltage V_READ is further reduced compared to the range 301 in FIG. 3. As the threshold voltage values SET_Vth and RESET_Vth change due to the drift phenomenon, the read voltage V_READ should be larger than the highest value B+$\alpha$ of the first threshold voltage values SET_Vth in the low resistance state (SET) and should be smaller than the lowest value C of the second threshold voltage values RESET_Vth in the high resistance state (RESET). Since there might be a memory cell in which the drift phenomenon does not occur, the read voltage V_READ should be smaller than C. That is, in the distributions of the threshold voltage values SET_Vth and RESET_Vth, after taking the drift phenomenon into consideration, the available range of the read voltage V_READ may be reduced to a range 402 of FIG. 4, which is narrower than the range 301 of FIG. 3.

Figure 5:
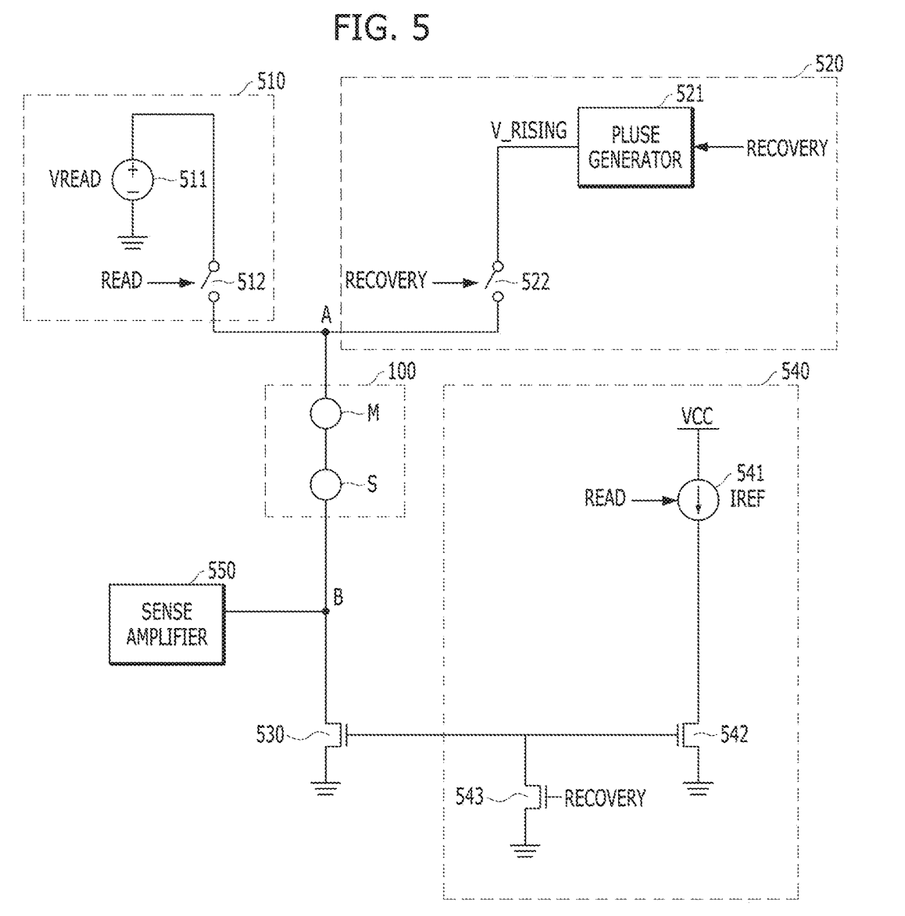
FIG. 5 is a diagram illustrating a semiconductor memory device according to an embodiment.

FIG. 5 is a diagram illustrating a semiconductor memory device according to an embodiment.

Referring to FIG. 5, the semiconductor memory device may include a memory cell 100, a read voltage application circuit 510, a voltage pulse application circuit 520, a current clamping transistor 530, a clamping control circuit 540, and a sense amplifier 550.

The memory cell 100 may include a resistive memory element M and a selection element S. FIG. 5 illustrates one memory cell 100 for illustrative convenience. However, the semiconductor memory device may include a plurality of memory cells arranged at intersections of a plurality of rows and a plurality of columns.

The read voltage application circuit 510 may apply a read voltage VREAD to a first node A in a read operation. Since the first node A is electrically connected to the memory cell 100, it can be understood that the read voltage application circuit 510 applies the read voltage VREAD to the memory cell 100. The read voltage application circuit 510 may include a voltage source 511 for supplying the read voltage VREAD and a switch 512 for supplying the read voltage VREAD to the first node A in response to a read signal READ which is activated in the read operation.

The voltage pulse application circuit 520 may apply a rising pulse voltage V_RISING to the first node A in a recovery operation. The voltage pulse application circuit 520 may include a voltage pulse generator 521 for generating the rising pulse voltage V_RISING in response to a recovery signal RECOVERY and a switch 522 for supplying the rising pulse voltage V_RISING to the first node A in response to the recovery signal RECOVERY which is activated in the recovery operation.

The current clamping transistor 530 may be coupled to a second node B to limit an amount of current flowing through the memory cell 100. The current clamping transistor 530 may be an NMOS transistor. The clamping control circuit 540 may control the current clamping transistor 530. The clamping control circuit 540 may allow a reference current IREF to flow through the current clamping transistor 530 in the read operation, and may turn off the current clamping transistor 530 in the recovery operation. The clamping control circuit 540 may include a current source 541, which is activated in response to the read signal READ to supply the reference current IREF, an NMOS transistor 542 for mirroring the reference current IREF, and an NMOS transistor 543 for turning off the current clamping transistor 530 in response to the recovery signal RECOVERY.

The sense amplifier 550 may read data stored in the memory cell 100 by sensing a voltage level at the second node B. The first node A and the second node B are connected to both ends of the memory cell 100, respectively.

Hereinafter, the recovery and read operations of the semiconductor memory device of FIG. 5 will be described.

Recovery Operation

The recovery operation may be performed to recover a change in a threshold voltage value of the memory cell 100, the change being generated by the drift phenomenon. The drift recovery of the memory cell 100 is achieved when an amount of current flowing through the selection element S is equal to or greater than a threshold current value Ith. Accordingly, the recovery operation may be performed by allowing a current equal to or greater than the threshold current value Ith to flow through the memory cell 100. Since data stored in the resistive memory element M of the memory cell 100 should not be changed in the recovery operation, it is necessary to prevent the amount of current flowing through the selection element S from excessively increasing when the recovery operation is performed. Supposing a current amount that changes the high resistance (amorphous) state (RESET) to the low resistance (crystalline) state (SET) of the memory element M is Iset, the current flowing through the memory cell 100 is limited to be equal to or less than Iset in the recovery operation. That is, it is preferable to allow an amount of current, which is equal to or greater than the threshold current value Ith and smaller than Iset, to flow through the memory cell 100 in the recovery operation.

In the recovery operation, the recovery signal RECOVERY is activated, and thus the NMOS transistor 543 is turned on. As a result, a gate of the current clamping transistor 530 may be grounded, and thus the current clamping transistor 530, which is an NMOS transistor, may be turned off.

Furthermore, in the recovery operation, the voltage pulse application circuit 520 is activated by the recovery signal RECOVERY, such that the rising pulse voltage V_RISING may be generated and applied to the first node A. In this case, since the current clamping transistor 530 acts like a capacitor when it is turned off, the voltage level at the second node B may be instantaneously increased by the rising pulse voltage V_RISING applied to the first node A. The current flowing through the current clamping transistor 530 may be expressed by Equation 1 below.

$$I=C(dV/dt) \quad \text{(Equation 1)}$$

In Equation 1 above, C denotes the capacitance of the current clamping transistor 530 in a turn-off state, dt denotes a time change amount, and dV denotes a voltage level change amount at the second node B coupled to a drain terminal of the current clamping transistor 530.

Figure 6:
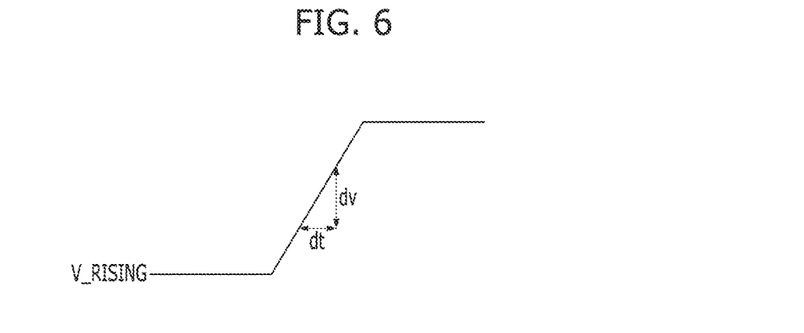
FIG. 6 is a diagram illustrating a rising pulse voltage.

When the current clamping transistor 530 is turned off, since no current flows through the memory cell 100 except an instantaneous current, the voltage levels at the first node A and the second node B are approximately equal to each other. That is, a level of the rising pulse voltage V_RISING applied to the node A and the voltage level at the second node B are approximately equal to each other. As a consequence, in Equation 1 above, since dV becomes a voltage change amount of the rising pulse voltage V_RISING and dt is a time change amount, it is possible to adjust the amount of current instantaneously flowing through the current clamping transistor 530, that is, the amount of current instantaneously flowing through the memory cell 100, by adjusting the slope of a voltage level change of the rising pulse voltage V_RISING. The slope of the voltage level change of the rising pulse voltage V_RISING may be controlled to adjust an amount of current I flowing through the current clamping transistor 530 to be equal to or greater than the threshold current value Ith. As a result, the drift recovery of the memory cell 100 may be achieved. FIG. 6 illustrates the rising pulse voltage V_RISING.

When the recovery operation is performed, since the drift recovery of the memory cell 100 is achieved, an available range of the read voltage VREAD applied to the memory cell 100 is widened, and thus it is possible to more stably perform the read operation.

Read Operation

In the read operation that is performed after the recovery operation, the read signal READ may be applied to the first node A. Furthermore, in response to the read signal READ that is enabled, the current source 541 in the clamping control circuit 540 may be activated, and thus the reference current IREF may flow through the NMOS transistor 542. In the read operation, since the NMOS transistor 543 is turned off, the reference current IREF flowing through the NMOS transistor 542 can be mirrored to the current clamping transistor 530. Accordingly, the current having substantially the same value as that of the reference current IREF may also flow through the current clamping transistor 530. The reference current IREF may have a value larger than an amount of current flowing through the memory cell 100 when the resistive memory element M of the memory cell 100 is in the high resistance state, and may have a value smaller than an amount of current flowing through the memory cell 100 when the resistive memory element M of the memory cell 100 is in the low resistance state.

When the resistive memory element M of the memory cell 100 is in the high resistance state, the reference current IREF is larger than the amount of current flowing through the memory cell 100. Accordingly, the second node B has a relatively low voltage level. However, when the resistive memory element M of the memory cell 100 is in the low resistance state, the amount of current flowing through the memory cell 100 is larger than the reference current IREF. Accordingly, the second node B may have a relatively high voltage level. The sense amplifier 550 senses the voltage level at the second node B, thereby determining whether the resistive memory element M of the memory cell 100 is in the high resistance state or the low resistance state, that is, thereby sensing data stored in the resistive memory element M.

As described above, when the recovery operation is performed before the read operation, the drift recovery of the memory cell 100 is achieved, such that it is possible to perform the read operation more stably.

The above and other memory circuits or semiconductor devices based on the disclosed technology can be used in a range of devices or systems. FIGS. 7-11 provide some examples of devices or systems that can implement the memory circuits disclosed herein.

Figure 7:
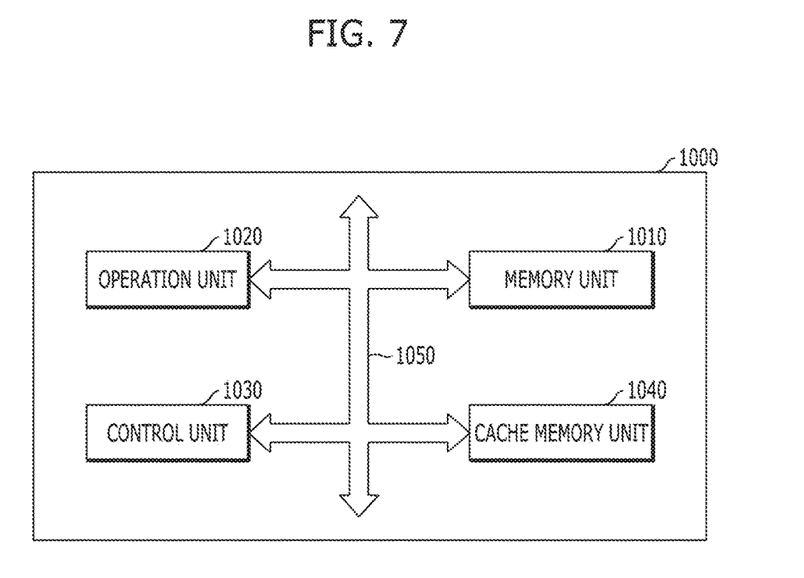
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, the read operation of the memory unit 1010 may be improved. Since the memory unit 1010 according to the present implementation may be improved in operating precision, the microprocessor 1000 may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
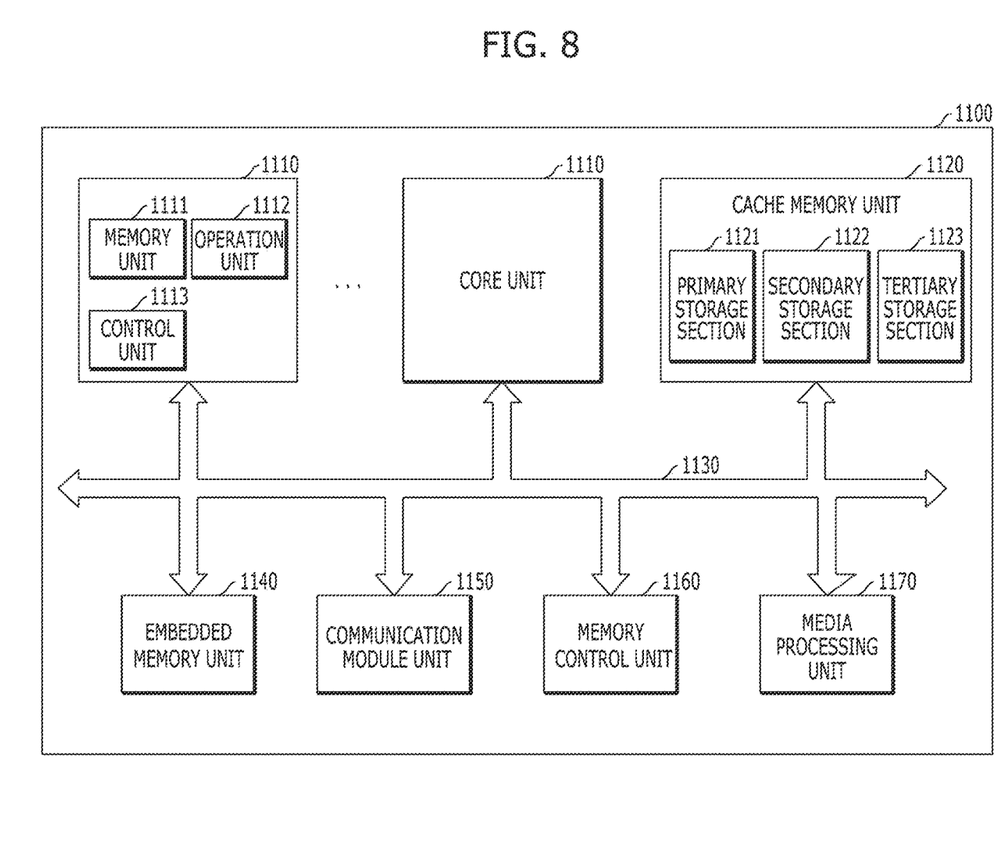
FIG. 8 shows an example of a configuration diagram of a processor implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, the read operation of the cache memory unit 1120 may be improved. Since the cache memory unit 1120 according to the present implementation may be improved in operating precision, the core unit 1110 may be improved in performance.

Although it was shown in FIG. 8 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
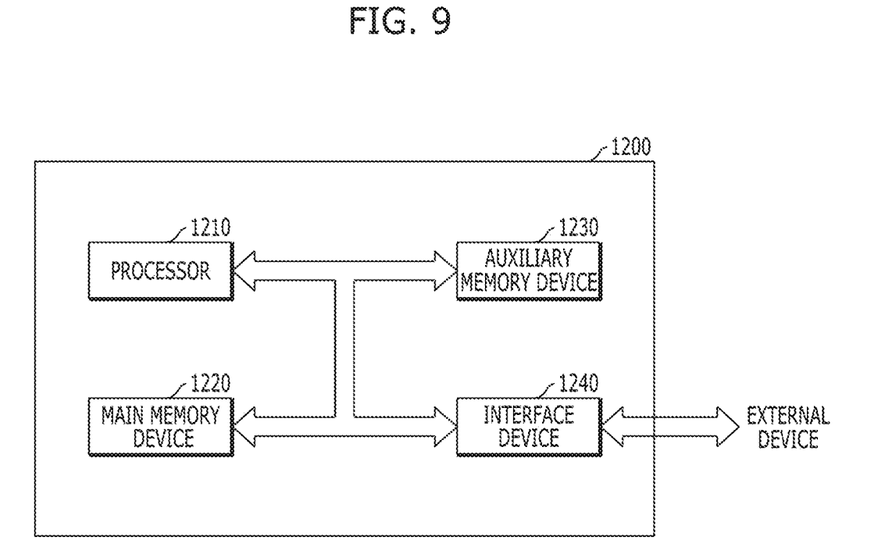
FIG. 9 shows an example of a configuration diagram of a system implementing memory circuitry based on the disclosed technology.

FIG. 9 is a configuration diagram of a system based on another implementation of the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, the operating precision of the main memory device 1220 may be improved. Since the main memory device 1220 according to the present implementation may be improved in operating precision, the system 1200 may be improved in portability and performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, the operating precision of the auxiliary memory device 1230 may be improved. Since the auxiliary memory device 1230 according to the present implementation may be improved in operating precision, the system 1200 may be improved in performance.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
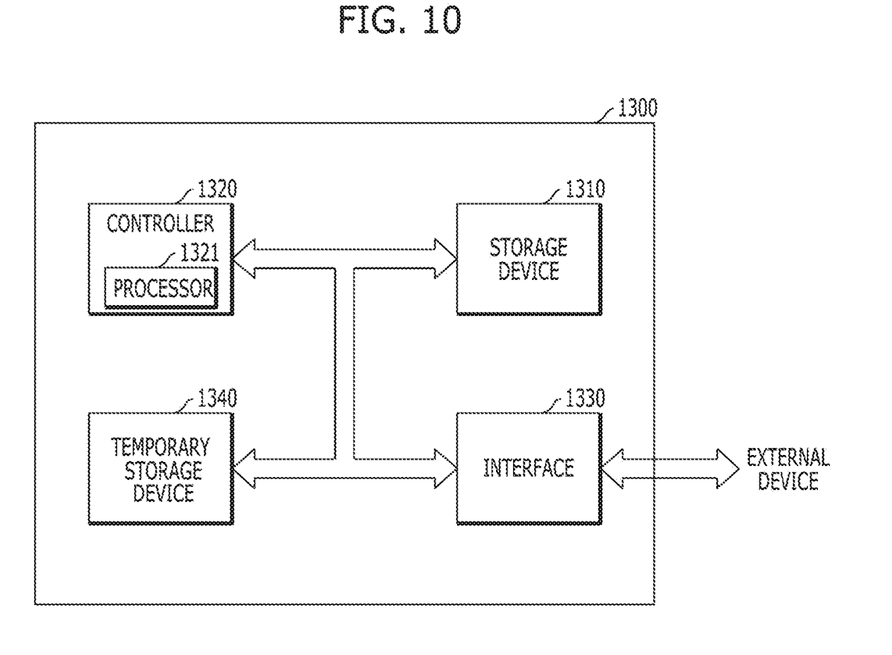
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, read operation of the storage device 1310 or the temporary storage device 1340 may be improved. Since the storage device 1310 or the temporary storage device 1340 according to the present implementation may be improved in operating precision, the data storage system 1300 may be improved in performance.

Figure 11:
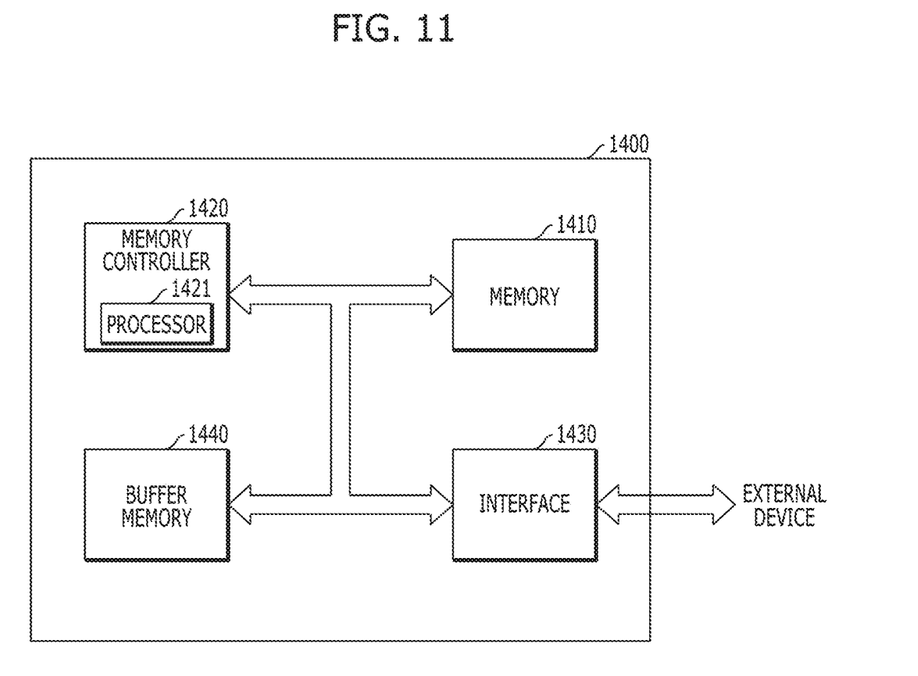
FIG. 11 shows an example of a configuration diagram of a memory system implementing memory circuitry based on the disclosed technology.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a memory cell including a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, read operation of the memory 1410 may be improved. Since the memory 1410 according to the present implementation may be improved in operating precision, the memory system 1400 may be improved in performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a memory cell including a resistive memory element having a high resistance state and a low resistance state according to stored data, and a selection element coupled serially to the resistive memory element; and a current clamping transistor electrically connected to a first end of the memory cell to limit an amount of a current flowing through the memory cell, wherein in a drift recovery operation of the memory cell, a rising pulse voltage is applied to a second end of the memory cell in a state in which the current clamping transistor has been turned off, the first end facing the second end. Through this, read operation of the buffer memory 1440 may be improved. Since the buffer memory 1440 according to the present implementation may be improved in operating precision, the memory system 1400 may be improved in performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
    a memory cell including a resistive memory element and a selection element that are connected in series, the resistive memory element configured to have a first resistance state or a second resistance state according to data stored in the memory cell; and
    a current clamping NMOS transistor electrically coupled to a first node of the memory cell to limit an amount of current flowing through the memory cell,
    wherein in a recovery operation for compensating for a drift amount of a threshold voltage value of the memory cell, a voltage having a rising pulse is applied to a second node of the memory cell while a ground voltage is applied to a gate of the current clamping NMOS transistor, the first node and the second node provided at opposing sides of the memory cell, the drift amount being generated by a drift phenomenon that occurred in the memory cell.

2. The electronic device of claim 1, wherein the selection element has a snapback characteristic such that a voltage level at the first and second nodes of the memory cell is significantly reduced in a short time.

3. The electronic device of claim 1, wherein the selection element includes an OTS (Ovonic Threshold Switch) element.

4. The electronic device of claim 3, wherein a voltage change of the rising pulse voltage is adjusted such that an amount of current, which is equal to or greater than a threshold current value, flows through the memory cell.

5. The electronic device of claim 1, wherein in a read operation of the memory cell, a voltage level at the gate of the current clamping NMOS transistor is controlled such that an amount of current, which is greater than an amount of current flowing through the memory cell when the resistive memory element of the memory cell is in the first resistance state and is smaller than an amount of current flowing through the memory cell when the resistive memory element of the memory cell is in the second resistance state, flows through the current clamping NMOS transistor, where the first and second resistance states are high and low resistance states, respectively, and
    wherein the first and second nodes correspond to first and second ends of the memory cell, respectively.

6. The electronic device of claim 1, wherein the semiconductor memory further comprises:
    a sense amplifier that senses a voltage level at the first node of the memory cell in the read operation.

7. The electronic device of claim 1, wherein the semiconductor memory further comprises:
    a voltage pulse generator that applies the rising pulse voltage to the second node of the memory cell in the recovery operation.

8. The electronic device according to claim 1, further comprising a microprocessor which includes:
    a control unit that is configured to receive a signal including a command from an outside of the microprocessor, and performs extracting, decoding of the command, or controlling input or output of a signal of microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit that includes the resistance variable element is part of the memory unit in the microprocessor.

9. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that includes the resistance variable element is part of the cache memory unit in the processor.

10. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between the processor, the auxiliary memory device or the main memory device and an outside, wherein the semiconductor memory that includes the resistance variable element is part of the auxiliary memory device or the main memory device in the processing system.

11. The electronic device according to claim 1, further comprising a data storage system which includes:

a storage device configured to store data and conserve stored data regardless of power supply;

a controller configured to control input and output of data to and from the storage device according to a command inputted from an outside;

a temporary storage device configured to temporarily store data exchanged between the storage device and the outside; and an interface configured to perform communication between at least one of the storage device, the controller and the temporary storage device and the outside, wherein the semiconductor memory that includes the resistance variable element is part of the storage device or the temporary storage device in the data storage system.

12. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory that includes the resistance variable element is part of the memory or the buffer memory in the memory system.

* * * * *